United States Patent
Oh et al.

(10) Patent No.: US 7,846,754 B2
(45) Date of Patent: Dec. 7, 2010

(54) HIGH POWER LIGHT EMITTING DIODE PACKAGE AND METHOD OF PRODUCING THE SAME

(75) Inventors: Kyung Seob Oh, Incheon (KR); Jae Ky Roh, Gyunggi-do (KR); Jung Kyu Park, Seoul (KR); Jong Hwan Baek, Seoul (KR); Seung Hwan Choi, Seoul (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 0 days.

(21) Appl. No.: 12/548,565

(22) Filed: Aug. 27, 2009

(65) Prior Publication Data

US 2009/0311811 A1 Dec. 17, 2009

Related U.S. Application Data

(62) Division of application No. 11/808,810, filed on Jun. 13, 2007, now Pat. No. 7,598,528.

(30) Foreign Application Priority Data

Jul. 10, 2006 (KR) .................. 10-2006-0064439

(51) Int. Cl.
*H01L 21/44* (2006.01)
*H01L 21/48* (2006.01)
*H01L 21/50* (2006.01)

(52) U.S. Cl. .................. 438/29; 438/116; 438/126; 257/E21.502

(58) Field of Classification Search .................. 438/29, 438/116, 126; 257/E21.502
See application file for complete search history.

(56) References Cited

U.S. PATENT DOCUMENTS

| 6,858,879 | B2 | 2/2005 | Waitl et al. |
| 7,166,873 | B2 | 1/2007 | Okazaki |
| 7,445,354 | B2 | 11/2008 | Aoki et al. |
| 7,696,590 | B2 * | 4/2010 | Waitl et al. ................. 257/434 |

(Continued)

FOREIGN PATENT DOCUMENTS

| JP | 2006-93435 A | 4/2006 |
| KR | 10-2005-0111298 A | 11/2005 |

OTHER PUBLICATIONS

Korean Office Action, issued in corresponding Korean Patent Application No. KR 10-2006-0064439, dated on Jul. 26, 2007.

*Primary Examiner*—Ngan Ngo
(74) *Attorney, Agent, or Firm*—McDermott Will & Emery LLP

(57) ABSTRACT

A high power Light Emitting Diode (LED) package and a method of producing the same. The high power LED package according to the present invention includes a plurality of light emitting diode chips, a first lead frame with the light emitting diode chips mounted thereon, and a second lead frame disposed at a predetermined interval from the first lead frame. The LED package also includes a package body fixing the first and second lead frames and bonding wires for electrically connecting the plurality of LED chips with upward-inclined inner side walls thereof and a second reflecting part surrounding the entire plurality of LED chips with an upward-inclined inner side wall thereof.

6 Claims, 4 Drawing Sheets

U.S. PATENT DOCUMENTS

| | | | |
|---|---|---|---|
| 7,705,435 B2 * | 4/2010 | Shih | 257/676 |
| 7,717,589 B2 * | 5/2010 | Nishioka et al. | 362/293 |
| 2004/0084681 A1 | 5/2004 | Roberts | |
| 2006/0065957 A1 | 3/2006 | Hanya | |
| 2007/0097683 A1 | 5/2007 | Chikugawa | |
| 2008/0023721 A1 | 1/2008 | Lee et al. | |
| 2009/0003003 A1 | 1/2009 | Park | |
| 2009/0065799 A1 | 3/2009 | Kim et al. | |
| 2009/0121253 A1 | 5/2009 | Abe | |
| 2009/0321918 A1 * | 12/2009 | Lin et al. | 257/690 |
| 2010/0112735 A1 * | 5/2010 | Lee et al. | 438/27 |
| 2010/0155771 A1 * | 6/2010 | Bando | 257/99 |

* cited by examiner (a)

(b)

HIGH POWER LIGHT EMITTING DIODE PACKAGE AND METHOD OF PRODUCING THE SAME

CLAIM OF PRIORITY

This application is a Divisional of U.S. application Ser. No. 11/808,810, filed on Jun. 13, 2007, now U.S. Pat. No 7,598,528 and claims the benefit of Korean Patent Application No. 2006-0064439 filed on Jul. 10, 2006, in the Korean Intellectual Property Office, the entire contents of each of which are incorporated herein by reference.

BACKGROUND OF THE INVENTION

1. Field of the Invention

The present invention relates to a high power Light Emitting Diode (LED) package and a method of producing the same and, more particularly, to a high power LED package which can effectively increase the light extraction efficiency, and a method of producing the same.

2. Description of the Related Art

In general, LEDs, which convert electric signals to light using characteristics of compound semiconductors, have advantages such as longer lifetime than other types of light emitters, low driving voltage and low power consumption. In addition, LEDs have a high response rate, high resistance to impacts, and readily accommodate miniaturization and light-weight applications.

With the recent trend of miniaturization and slimmer designs of information communication devices, resistors, condensers, noise filters and the like are more and more miniaturized these days and fabricated into surface mount device types so as to be directly mounted to Printed Circuit Boards (PCBs). Accordingly, LED lamps are also developed into surface mount device types. Such surface mount device type LED lamps can replace the conventional simple configuration of lamps with uses in lighting displays, text displays and image displays in various colors.

As the usage of LEDs has expanded as described above, the amounts of luminance required for the lamps for daily use and lamps for emergency signals and the like have increased, which led to recent extensive use of high power LED packages. For example, the high power LED packages increase the light outputs with a plurality of LED chips mounted therein.

FIGS. 1(a) and (b) are a plan view and a sectional view illustrating a conventional high power LED package. Referring to FIGS. 1(a) and (b), the high power LED package 10 includes a package body 11, a first lead frame 12, a second lead frame 13, a plurality of LED chips 15 mounted on the first lead frame 12, and bonding wires 16 electrically connecting the plurality of LED chips 15. The package body 11 has a reflector 14 surrounding the entire plurality of LED chips 15, and the reflector 14 has an inclined inner side. The light emitted in lateral directions from each of the plurality of LED chips 15 is reflected at the inner side of the reflector 14 to be emitted through the upper part of the LED package 10.

However, in the conventional LED package 10, only one inclined reflector 14 is formed to surround the plurality of LED chips, and thus the light beams emitted from the adjacent LED chips interfere with each other, degrading the light extraction efficiency.

SUMMARY OF THE INVENTION

The present invention has been made to solve the foregoing problems of the prior art and therefore an aspect of the present invention is to provide a high power LED package which prevents interference of light beams among adjacent LED chips, thereby effectively increasing the light extraction efficiency, and a method of producing the same.

According to an aspect of the invention, the invention provides a high power LED package, which includes: a plurality of light emitting diode chips; a first lead frame with the plurality of light emitting diode chips mounted thereon and a second lead frame disposed apart at a predetermined interval from the first lead frame; a package body fixing the first and second lead frames; and bonding wires for electrically connecting the plurality of light emitting diode chips, wherein the package body comprises at least one first reflecting part separately surrounding each of the plurality of light emitting diode chips with upward-inclined inner side walls thereof, and a second reflecting part surrounding the entire plurality of light emitting diode chips with an upward-inclined inner side wall thereof.

Preferably, the first lead frame includes a planar base and an extension extending from an edge of the base. In addition, the package body may expose a portion of undersurface of the base of the first lead frame.

The high power light emitting diode package may further include a resin encapsulant for encapsulating the plurality of light emitting diode chips. Preferably, the resin encapsulant is made of one selected from the group consisting of a silicone-based resin, an epoxy resin, a urethane-based resin and mixtures thereof. In addition, the resin encapsulant may contain phosphor.

Preferably, the bonding wires may extend over upper parts of the first reflecting part to electrically connect the adjacent ones of the light emitting diode chips.

According to another aspect of the invention, the invention provides a method of producing a high power LED package. The method includes preparing a first lead frame and a second lead frame; injection-molding a resin to surround the first and second lead frames to form a package body fixing the first and second lead frames, the package body comprising at least one first reflecting part surrounding predetermined portions on the first lead frame with upward-inclined inner side walls thereof, and a second reflecting part surrounding the at least one first reflecting part with an upward-inclined inner side wall thereof; mounting a plurality of light emitting diode chips on the first lead frame so as to be surrounded by the first reflecting part; electrically connecting the plurality of light emitting diode chips with bonding wires; and encapsulating the plurality of light emitting diode chips with a resin encapsulant.

The step of electrically connecting the plurality of light emitting diode chips with bonding wires may include extending bonding wires over upper parts of the first reflecting part to electrically connect the adjacent ones of the light emitting diode chips.

The first lead frame may include a planar base and an extension extending from an edge of the base.

The package body forming step may include forming the base of the first lead frame such that a portion of undersurface of the base of the first lead frame is exposed.

Preferably, the resin encapsulant is made of one selected from the group consisting of a silicone-based resin, an epoxy resin, a urethane-based resin, and mixtures thereof, and the resin encapsulant may contain phosphor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
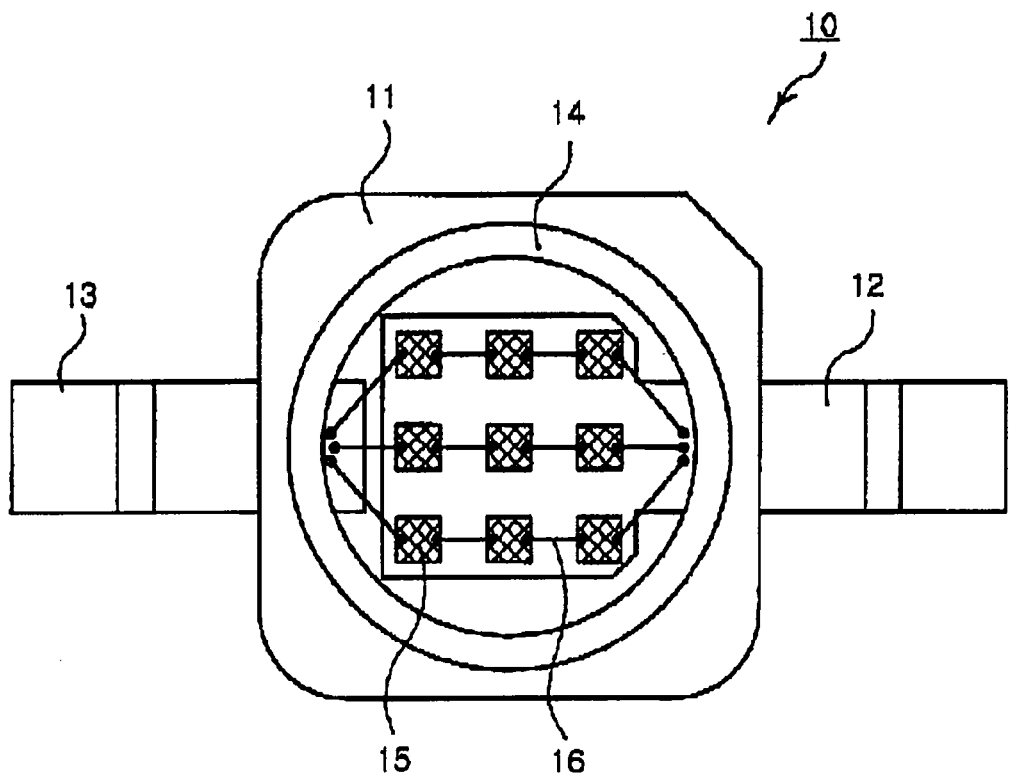
FIGS. 1(a) and (b) are a plan view and a sectional view illustrating a conventional high power LED package.
Figure 1:
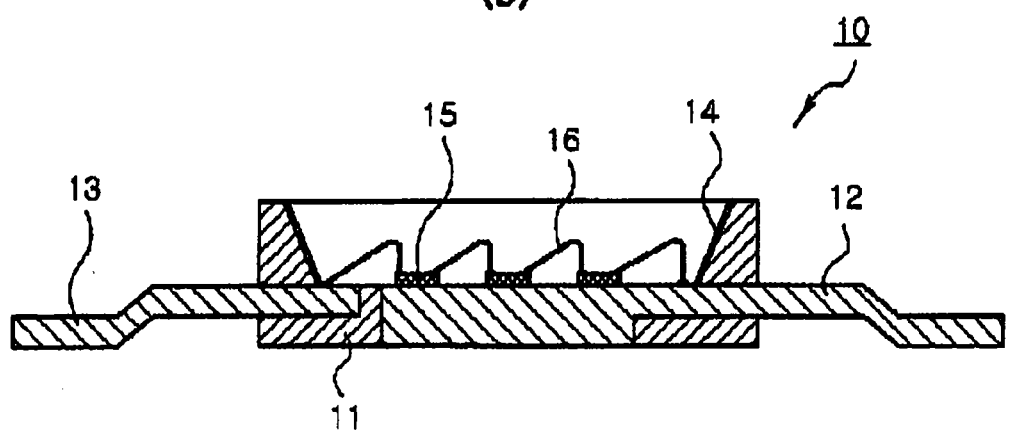

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity and the same reference numerals are used throughout to designate the same or like components.

Figure 2:
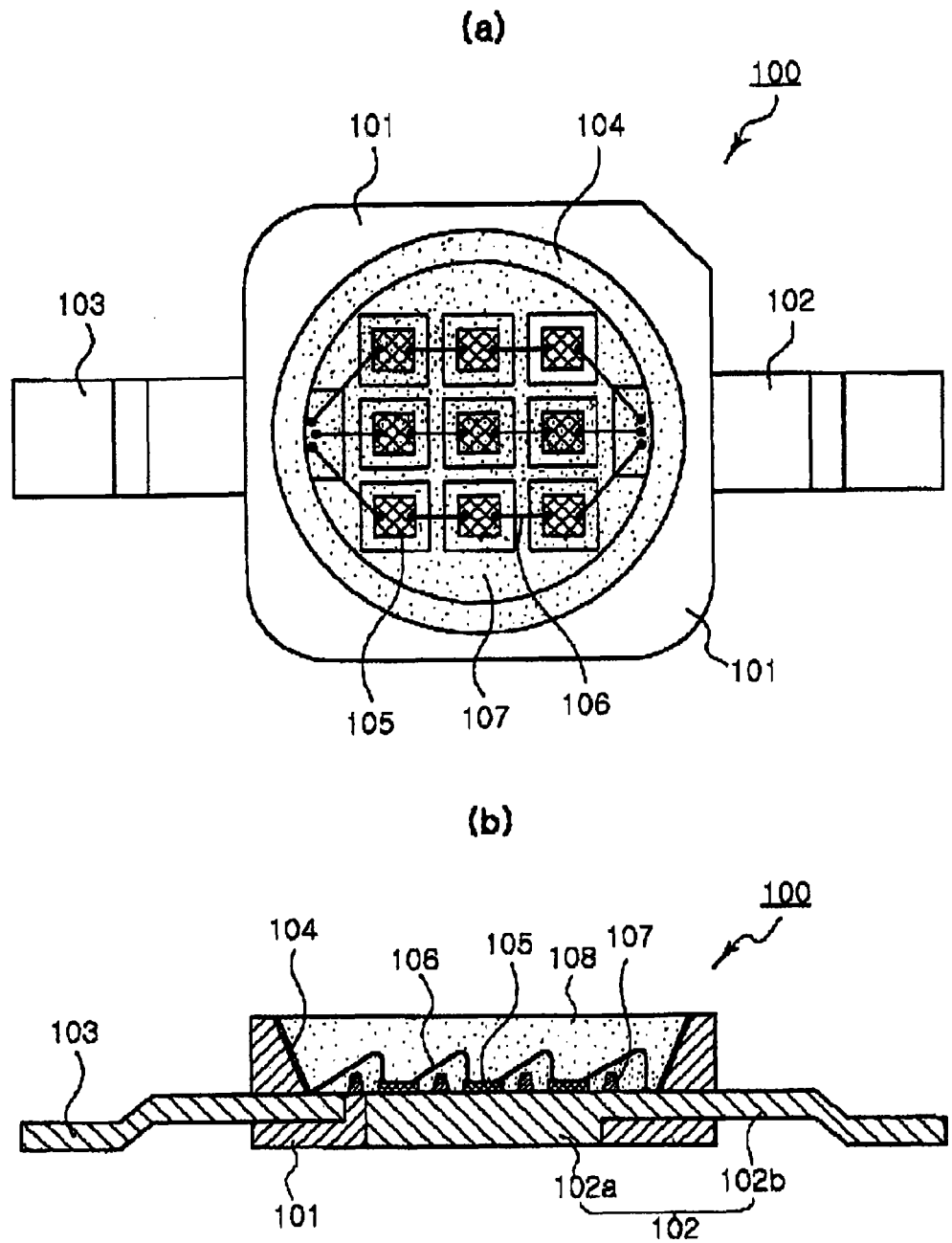
FIG. 2(a) and (b) are a plan view and a sectional view illustrating a high power LED package according to the present invention.

FIGS. 2(a) and (b) are a plan view and a sectional view illustrating a high power LED package 100 according to the present invention.

Referring to FIGS. 2(a) and (b), the high power LED package 100 according to the present invention includes a plurality of LED chips 105, a first lead frame 102, a second lead frame 103, a package body 101 having at least one first reflecting part 107 and a second reflecting part 104, bonding wires 106 and a resin encapsulant 108 for encapsulating the plurality of the LED chips 105.

The package body 101 serves to fix the first and second lead frames 102 and 103, and can be formed by injection-molding a resin around the first and second lead frames 102 and 103. The package body 101 has the at least one first reflecting part 107 separately surrounding each of the plurality of LED chips 105 and the second reflecting part 104 surrounding the entire plurality of LED chips 105.

The first reflecting part 107 is formed to separately surround each of the plurality of LED chips 105 mounted on the first lead frame 102, and the second reflecting part 104 is formed to surround the entire plurality of LED chips 105. The second reflecting part 104 is not formed in correspondence with each of the LED chips 105, but is an overall structure for focusing and emitting light from the entire LED package 100. The first and second reflecting parts 107 and 104 are inclined upward. Therefore, the light emitted in lateral directions from the LED chips 105 is reflected by the first reflecting part 107 and emitted through the upper part of the LED package 100. In addition, the light beams from the entire package, i.e., reflected by the first reflecting part 107 or directly emitted from the LED chips 105 are focused by the second reflecting part 104. The light extraction efficiency of the entire LED package 100 is significantly enhanced by such first and second reflecting parts 107 and 104.

In addition, surrounding each of the plurality of LED chips 105, the first reflecting part 107 thus prevents the problematic interference between the light beams among the adjacent LED chips, which degrades light extraction efficiency.

The first lead frame 102 and the second lead frame 103 are metal plates functioning as leads for connecting the LED chips to a circuit outside and for fixing the LED package to a circuit board outside the package. The first and second lead frames 102 and 103 have excellent electric conductivity and elongation ratio, and can be made of a highly reflective metal so as to reflect the light from the LED chips 105 to the upper part of the LED package 100. Preferably, they can be made of Ag or Cu, or by Ag plating. The first lead frame 102 may be composed of a planar base 102a and an extension 102b extending from an edge of the base 102a. The plurality of LED chips 105 can be mounted on the base 102a. The plurality of LED chips 105 can be fixed on the first lead frame 102 by an adhesive means such as an Ag epoxy or an eutectic solder. The package body 101 can be formed to expose a part of undersurface of the first lead frame base 102a. With this configuration of the lead frame and the package body, the heat generated from the plurality of LED chips 105 can be effectively radiated. The extension 102b is formed in a width smaller than that of the base 102a but is not limited thereto. The second lead frame 103 is disposed apart at a predetermined interval from the first lead frame 102, and forms a package electrode of a polarity opposite from that of the first lead frame 102.

Each of the LED chips 105 can be made of a material that satisfies conditions such as presence of a light emission wavelength in a visible or near ultra-violet ray region, high light emission efficiency and feasibility of p-n junction. Such materials may include compound semiconductors such as GaN, GaAs, GaP, $GaAs_{1-x}P_x$, $Ga_{1-x}Al_xAs$, InP, $In_{1-x}Ga_xP$, etc.

The bonding wires 106 are components for connecting and transmitting electric signals between the first lead frame 102 and the LED chips, between the second lead frame 103 and the LED chips or between the adjacent LED chips. The bonding wires 106 can be made of Cu, Au or Au—Ag alloys. As each of the plurality of LED chips 105 is surrounded by the first reflecting part 107, the bonding wires 106 can extend over upper parts of the first reflecting part 107 to electrically connect the adjacent LED chips.

The resin encapsulant 108 is formed in a cavity defined by the second reflector 104 to encapsulate the plurality of LED chips 105. The resin encapsulant 108 can be made of one selected from the group consisting of an epoxy resin, a silicone-based resin and mixtures thereof. The resin encapsulant 108 can be injected through a known process such as a dispensing process.

The resin encapsulant 108 may contain phosphor (not shown). The phosphor is a material that absorbs and emits light generated from the LED chips 105 or absorbs and emits light generated from another phosphor. The LED chips can produce blue, green or red according to the types of impurities. Therefore, white light can be produced from combinations of LED chips and phosphor. For example, a blue LED chip can be combined with yellow or red/green phosphor to produce white light. Also, an ultra-violet LED chip can be combined with red/green/blue phosphor to produce white light. Further, red, green and blue LED chips can be combined to produce white light. Blue phosphor includes ZnS:Ag, ZnS:Ag+$In_2O_3$, ZnS:Zn+$In_2O_3$ and (Ba, Eu) $MgAl_{10}O_{17}$, green phosphor includes ZnS:Cu, $Y_2Al_5O_{12}$:Tb and $Y_2O_2S$:Tb, and red phosphor includes $Y_2O_2S$:Eu, $Y_2O_3$:Eu and $YVO_4$:Eu. In addition, yellow phosphor includes YAG:Ge and YAG:Ce.

The resin encapsulant 108 may include a scattering material or a diffuser mixed therein. The light is scattered or diffused by the scattering material or the diffuser dispersed in the resin encapsulant 108, thereby achieving broader light characteristics.

FIGS. 3a to 3e are sectional views illustrating a method of producing the high power LED package according to an embodiment of the present invention.

Figure 3A:
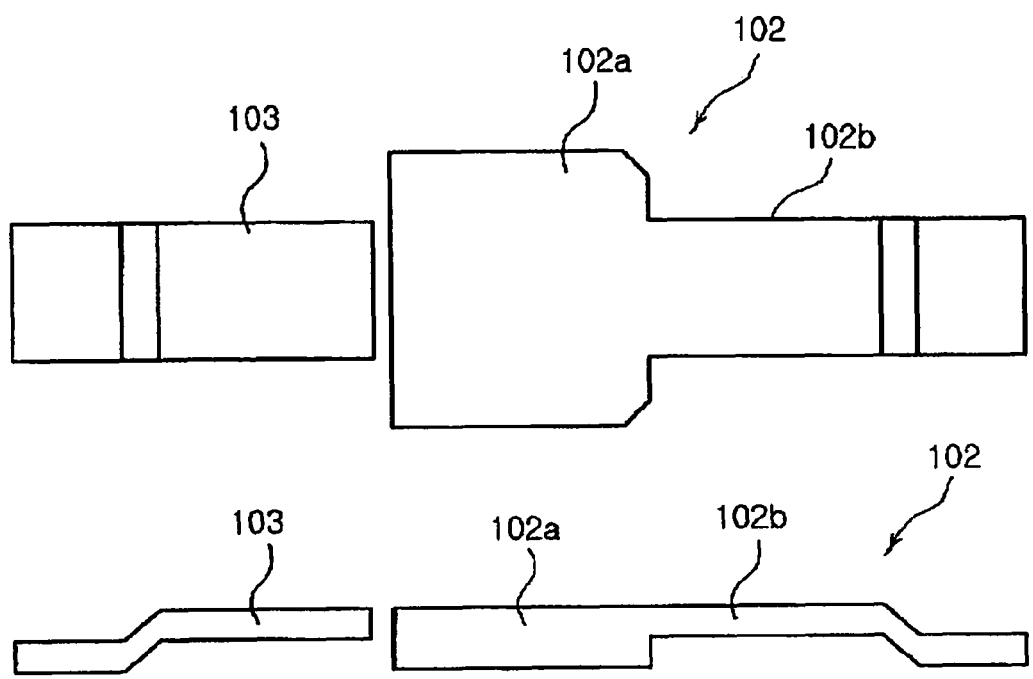
FIGS. 3a to 3e are sectional views illustrating a method of producing the high power LED package according to the present invention.

First, as shown in FIG. 3a, a first lead frame 102 and a second lead frame 103 are prepared. The first lead frame 102 adopted in this embodiment has a planar base 102a and an extension 102b extending from an edge of the base, and the second lead frame 103 formed in a width smaller than that of the first lead frame 102. A plurality of LED chips are mounted on the planar base 102a. The first and second lead frames 102 and 103 have excellent electric conductivity and elongation ratios, and can be made of a highly reflective material. Preferably, they can be made of Ag plating, Ag or Cu.

Figure 3B:
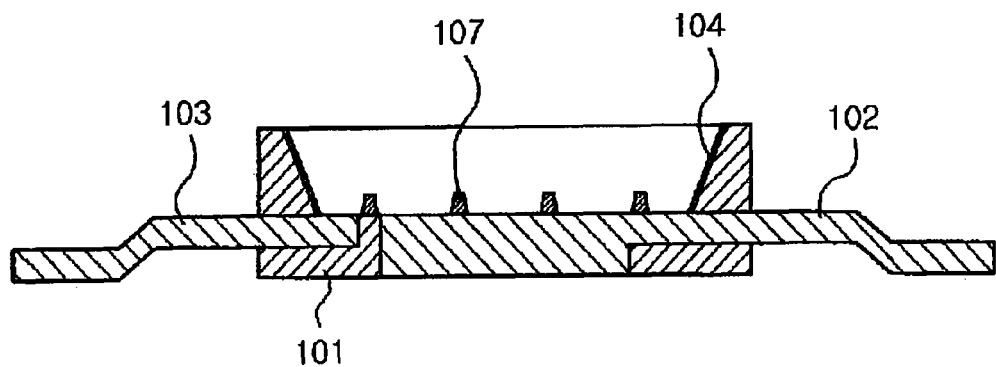

Next, as shown in FIG. 3b, a resin is injection-molded around the first and second lead frames 102 and 103 to obtain a package body 101. More specifically, the first and second lead frames 102 and 103 are inserted in a mold and the resin is injected into the mold to form the package body 101. The package body 101 has at least one upward-inclined first reflecting part 107 surrounding predetermined portions on the first lead frame 102, and a second reflecting part 104 surrounding the entire first reflecting part 107. Inner sides of the first and second reflecting parts 107 and 104 are all inclined upward. The package body 101 according to an embodiment of the present invention can be formed to expose a part of undersurface of the first lead frame base 102a. That is, as shown in FIG. 3b, an undersurface of the base 102a can be exposed through undersurface of the package body 101.

Figure 3C:
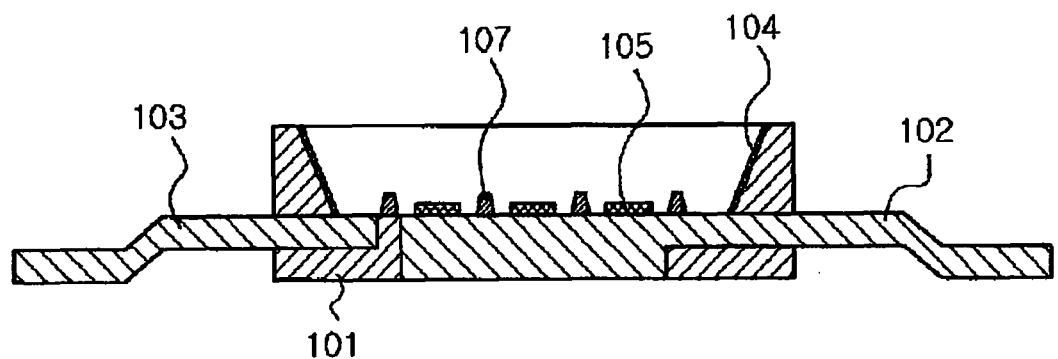

Next, as shown in FIG. 3c, the plurality of LED chips 105 are mounted on the first lead frame 102. Each of the plurality of LED chips 105 is mounted to be surrounded by the first reflecting part 107 formed on the first lead frame 102. This allows reducing the interference of light beams generated among the adjacent LED chips 105 by the first reflecting parts 107. In addition, the light generated from each of the plurality of LED chips 105 is reflected by the first reflecting part and emitted through the upper part of the LED package. The light beams from the entire package, i.e., reflected by the first reflecting part 107 and directly emitted from the LED chips 105 are focused by the second reflecting part 104 surrounding the entire LED chips.

Figure 3D:
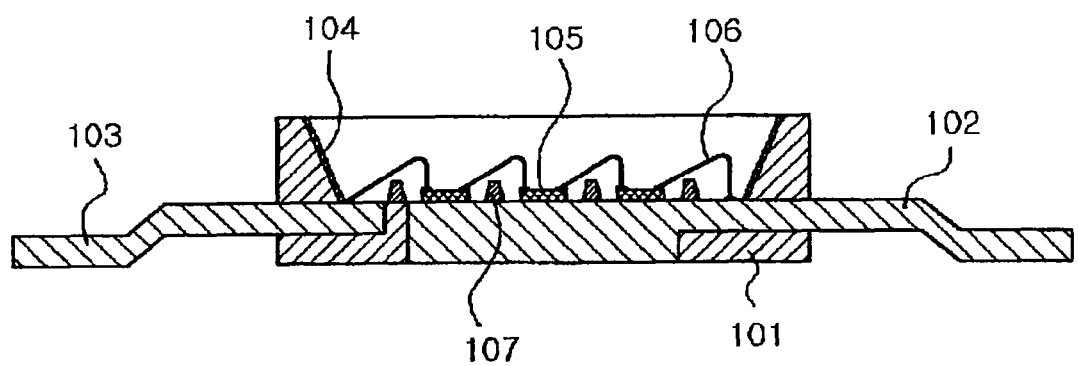

Then, as shown in FIG. 3d, the plurality of LED chips are electrically connected by the bonding wires 106. Each of the plurality of LED chips 105 has an n-electrode (not shown) and a p-electrode (not shown). Using the bonding wires 106, an n-electrode of an LED chip is bonded to a p-electrode of another adjacent LED chip. Each of the plurality of LED chips 105 is surrounded by the first reflecting part 107, and thus the bonding wires 106 can extend over upper part of the first reflecting part 107 to electrically connect between the LED chips.

Figure 3E:
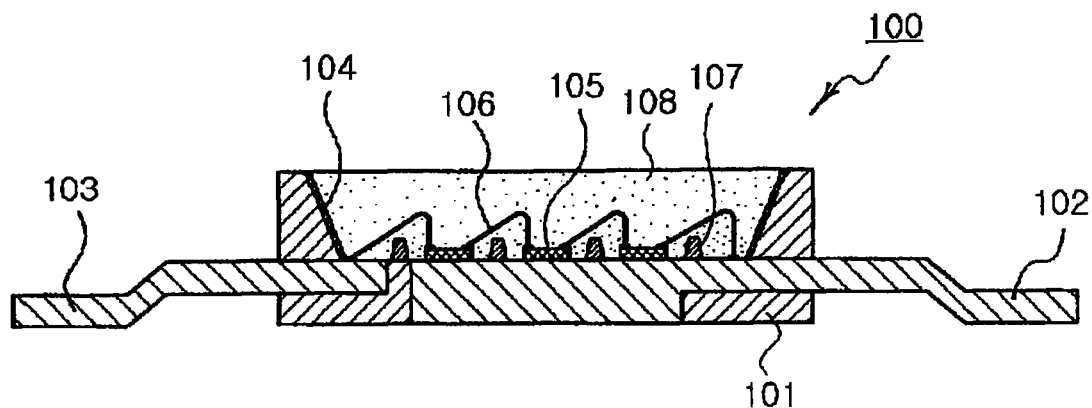

Finally, as shown in FIG. 3e, the plurality of LED chips are encapsulated by the resin encapsulant 108. The resin encapsulant can be made of one selected from the group consisting of a silicone resin, an epoxy resin, an urethane-based resin and mixtures thereof. The resin encapsulant 108 can be injected through a known process such as a dispensing process. In addition, the resin encapsulant 108 can include phosphor therein.

According to the present invention set forth above, a plurality of LED chips are mounted on one lead frame, and at least one first reflecting part separately surrounding each of the plurality of LED chips and a second reflecting part surrounding the entire LED chips are formed. This prevents interference of the light beams among the adjacent LED chips and focuses light generated from the LED chips, thereby significantly increasing light extraction efficiency.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of producing a high power light emitting diode package comprising:
   preparing a first lead frame and a second lead frame;
   injection-molding a resin to surround the first and second lead frames to form a package body fixing the first and second lead frames, the package body comprising at least one first reflecting part surrounding predetermined portions on the first lead frame with upward-inclined inner side walls thereof, and a second reflecting part surrounding the at least one first reflecting part with an upward-inclined inner side wall thereof;
   mounting a plurality of light emitting diode chips on the first lead frame so as to be surrounded by the first reflecting part;
   electrically connecting the plurality of light emitting diode chips with bonding wires; and
   encapsulating the plurality of light emitting diode chips with a resin encapsulant.

2. The method according to claim 1, wherein the resin encapsulant comprises one selected from the group consisting of a silicone-based resin, an epoxy resin, a urethane-based resin, and mixtures thereof.

3. The method according to claim 1, wherein the resin encapsulant comprises phosphor.

4. The method according to claim 1, wherein the electrically connecting the plurality of light emitting diode chips with bonding wires comprises extending bonding wires over upper parts of the first reflecting part to electrically connect the adjacent ones of the light emitting diode chips.

5. The method according to claim 1, wherein the first lead frame comprises a planar base and an extension extending from an edge of the base.

6. The method according to claim 5, wherein the forming a package body comprises forming the base of the first lead frame such that a portion of undersurface of the base of the first lead frame is exposed.

\* \* \* \* \*